US012638336B2

(12) United States Patent　　　　　(10) Patent No.:　US 12,638,336 B2

Peretz et al.　　　　　　　　　　　　(45) Date of Patent:　　May 26, 2026

(54) DIGITAL-DOMAIN-INTEGRATED, VOLTAGE-TO-FREQUENCY TEMPERATURE SENSOR

(71) Applicant: NVIDIA Corporation, Santa Clara, CA (US)

(72) Inventors: Naor Peretz, Nahariya (IL); Ofek Abadi, Kfar (IL); Ido Bourstein, Pardes Hana (IL)

(73) Assignee: NVIDIA Corporation, Santa Clara, CA (US)

( * ) Notice: Subject to any disclaimer, the term of this patent is extended or adjusted under 35 U.S.C. 154(b) by 436 days.

(21) Appl. No.: 18/208,512

(22) Filed: Jun. 12, 2023

(65) Prior Publication Data

US 2024/0410762 A1　　Dec. 12, 2024

(51) Int. Cl.
G01K 1/02　　　(2021.01)
G01K 7/34　　　(2006.01)
G05F 1/56　　　(2006.01)
H03K 3/03　　　(2006.01)

(52) U.S. Cl.
CPC ............... G01K 1/02 (2013.01); G01K 7/346 (2013.01); G05F 1/56 (2013.01); H03K 3/0315 (2013.01)

(58) Field of Classification Search
CPC .. G01K 1/02; G01K 7/00; G01K 7/01; G01K 7/34; G01K 7/346; H03K 3/0315; H03K 3/0322
See application file for complete search history.

(56) References Cited

U.S. PATENT DOCUMENTS

| | | | | |
|---|---|---|---|---|
| 11,437,981 | B1 * | 9/2022 | Liberti | H03K 3/0315 |
| 2013/0027139 | A1 * | 1/2013 | Chalamala | H03L 7/0995 |
| | | | | 331/57 |
| 2019/0204163 | A1 * | 7/2019 | Lin | G01K 7/186 |
| 2020/0366241 | A1 * | 11/2020 | Tsuji | H03L 7/18 |
| 2020/0386629 | A1 * | 12/2020 | Lin | G01K 7/01 |
| 2022/0416795 | A1 * | 12/2022 | Tsukamoto | H03L 7/00 |
| 2024/0113717 | A1 * | 4/2024 | Bahr | H03K 3/0315 |

OTHER PUBLICATIONS

In et al., "A 0.5 BJT-Based CMOS Thermal Sensor in 10-nm FinFET Technology", IEEE Asian Solid-State Circuits Conference, pp. 41-44, Nov. 6-8, 2017.

* cited by examiner

*Primary Examiner* — Levi Gannon
(74) *Attorney, Agent, or Firm* — Lowenstein Sandler LLP

(57)　　　　　ABSTRACT

An integrated circuit includes a bandgap reference circuit configured to generate, from a digital chip supply voltage, a reference voltage and a proportional-to-absolute temperature (PTAT) voltage. A voltage-to-frequency (VTF) readout circuit to receive the reference voltage and the PTAT voltage as inputs. The VTF readout circuit includes sets of switched capacitors that operate as a voltage divider. The capacitors of the sets of switched capacitors are selectively charged by the PTAT voltage and generate a feedback voltage. A voltage-controlled oscillator (VCO) is driven by a difference between the feedback voltage and the reference voltage and generates a VCO clock. A clock generator generates a feedback clock based on the VCO clock. First switches of the sets of switched capacitors are controlled by the feedback clock.

21 Claims, 9 Drawing Sheets

DIGITAL-DOMAIN-INTEGRATED, VOLTAGE-TO-FREQUENCY TEMPERATURE SENSOR

TECHNICAL FIELD

At least one embodiment generally pertains to computer systems, and more specifically, but not exclusively, to a digital-domain-integrated, voltage-to-frequency temperature sensor.

BACKGROUND

Heat dissipation requirements are increasing as more high-power-consuming integrated circuit (ICs) and systems on a chip (SoCs) are being designed and manufactured for myriad applications. As a result, chip makers are needing to integrate thermal sensors onto these chips within the digital domain, e.g., located near dense populations of digital circuitry, including logic and memory, which tend to become local hot spots on chip. By monitoring temperature changes, adjustments to design and runtime programming can be made to stay within maximum temperature specifications, for example.

In many high-power-consuming chips manufactured today, there are analog areas and digitally-synthesized areas with a dedicated digital supply voltage. Solutions to temperature monitoring have generally included integrating analog thermal sensors inside these digitally-synthesized areas. To do so, standard analog thermal sensors—each with a separate analog power supply and that uses analog-sensitive input and output signals—have to be inserted at points within the digital circuitry. This strategy, however, moves the problem from the design team to the chip integration team. It is very difficult to send and receive analog signals, which are sensitive to noise and interference, from the analog thermal sensors. It is also difficult to locate such analog thermal sensors in the digitally-synthesized areas that tend to cause hot spots. For example, it is difficult to find space for the analog thermal sensors and their analog power supplies. Choice of location may further be affected by not wanting to exacerbate hot spots to be measured with analog voltage supplies. These and other challenges create obstacles to typical use of analog thermal sensors in the digital domain, e.g., on chip of these ICs and SoCs.

BRIEF DESCRIPTION OF DRAWINGS

Various embodiments in accordance with the present disclosure will be described with reference to the drawings, in which.

DETAILED DESCRIPTION

Figure 1:
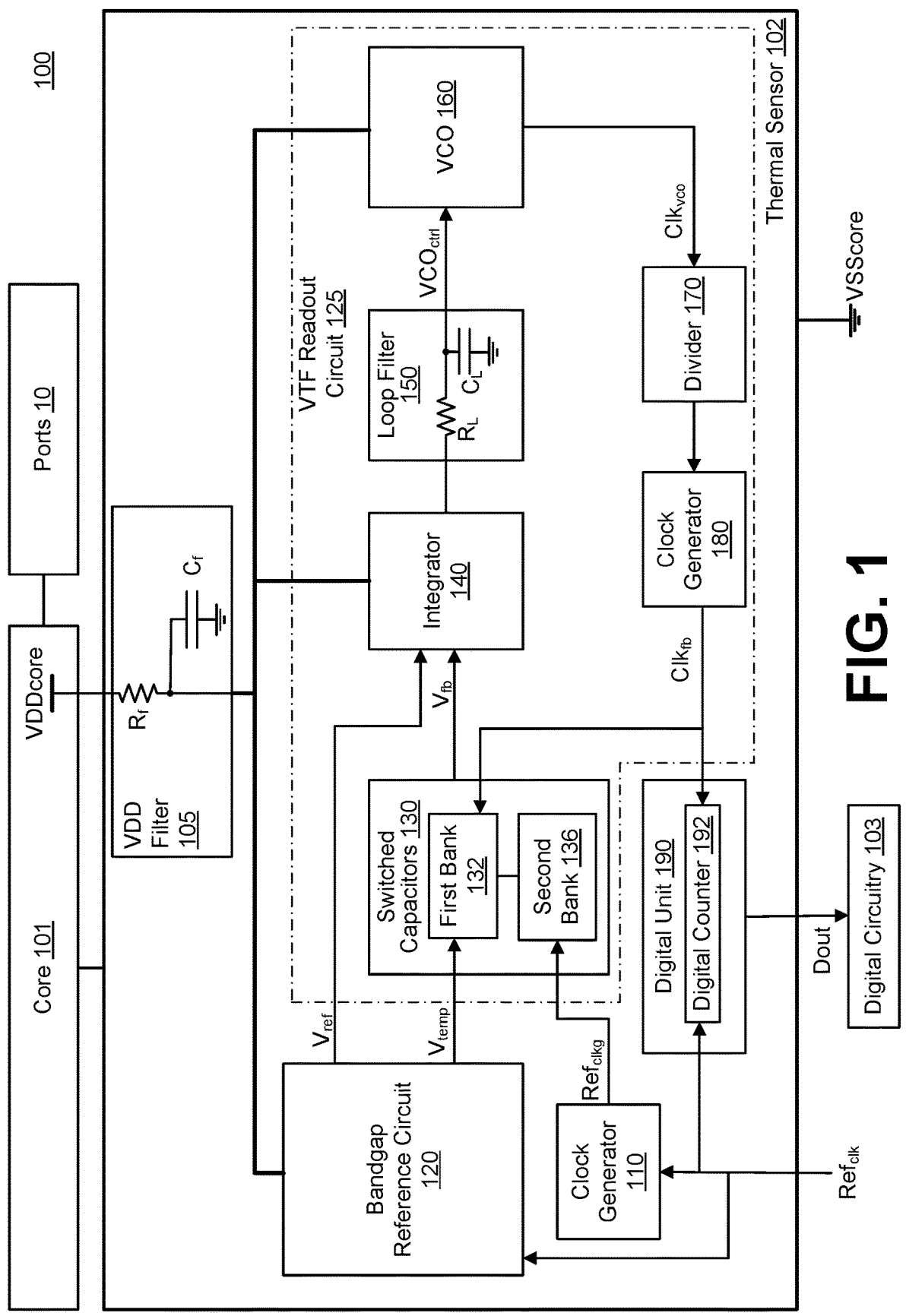
FIG. 1 is a schematic block diagram of an example integrated circuit having an example digital-domain-based thermal sensor according to various embodiments.

Aspects and embodiments of the present disclosure address the above temperature-monitoring issues in high-power-consuming ICs or SoCs by employing a robust, self-contained thermal sensor based within the digital domain and seamlessly integrated within digitally-synthesized areas of such chips. Although the disclosed digital-domain-based thermal sensor is an analog component, in various embodiments, this thermal sensor is custom designed for operation within the digital domain and thus to be treated like any other digital component. For example, in at least some embodiments, the disclosed thermal sensor interacts using full digital signals for inputs and outputs, relies on a digital interface like any other digital block, and is powered by a low-voltage digital power supply used on chip, e.g., VDD core supply.

In some of the high-power-consuming ICs or SoCs being designed today, hundreds of sensors are employed on chip, many of which are located near different digital units, making the VDD core quite noisy. Thus, the low-voltage digital power supply is typically noisy and, in some embodiments, a power supply filter is employed to filter out this noise before powering various analog components that make up the digital-domain-based thermal sensor.

In various embodiments, the disclosed thermal sensor includes a bandgap reference circuit configured to generate, from a digital chip supply voltage, a reference voltage and a proportional-to-absolute temperature (PTAT) voltage. In these embodiments, the thermal sensor further includes a voltage-to-frequency (VTF) readout circuit, which may be implemented as a closed loop, to receive the reference voltage and the PTAT voltage as inputs. For example, in some embodiments, the readout circuit includes sets of switched capacitors that operate as an effective voltage divider, which typically are implemented with resistors. Because resistors vary in temperature with varied current flow, e.g., have non-zero temperature coefficients, capacitors can instead be employed in order to accurately relate temperature to frequency. Capacitors also take up less space on chip.

In some embodiments, capacitors of the sets of switched capacitors are selectively charged by the PTAT voltage and generate a feedback voltage. In these embodiments, a voltage-controlled oscillator (VCO) is driven by a difference between the feedback voltage and the reference voltage and generates a VCO clock. In some embodiments, a clock generator generates a feedback clock based on the VCO clock. According to some embodiments, some (e.g., first capacitors) of a first bank of switched capacitors of the sets of switched capacitors are controlled by the feedback clock. In some embodiments, for example, the clock generator is a non-overlapping clock generator capable of generating differential outputs as will be explained.

In various embodiments, the feedback clock generated by the clock generator has the temperature information to be converted by the thermal sensor into a digital value. For example, because the cycle time of the feedback clock is proportional to the PTAT voltage, and the PTAT voltage is proportional to the temperature, the cycle time in the feedback clock is also proportional to temperature. Thus, according to these embodiments, by using an on-die digital unit to measure the frequency or cycle time of the feedback clock, a digital word (Dout) can be generated that has a value linearly proportional to temperature. This value can be read and used as a detected temperature value by other digital circuitry or components to which the digital word is provided.

Therefore, advantages of the chips (e.g., ICs, SoCs), devices, systems, and methods implemented in accordance with some embodiments of the present disclosure include, but are not limited to, the ability to seamless include the disclosed digital-domain-based thermal sensor anywhere on chip as another digital component. As will be discussed in more detail, this thermal sensor is seamlessly integrated because the thermal sensor can use the digital chip supply voltage, interacts via a digital interface, and can operate off of an existing reference clock already available within the chip. Other advantages will be apparent to those skilled in the art of thermal sensing and management within ICs and SoCs, as discussed hereinafter.

FIG. 1 is a schematic block diagram of an example integrated circuit 100 (e.g., IC, SoC, or integrated circuit chip) having an example digital-domain-based thermal sensor 102 according to various embodiments. In these embodiments, the integrated circuit 100 includes a processing core 101 (or other processor) that supplies the digital chip supply voltage, e.g., a positive power supply voltage also known as VDD, as well as core negative power supply voltage, also known as VSS, which may be ground or zero volts. In some embodiments, the integrated circuit 100 integrates many of the thermal sensors 102 within the digital domain, e.g., digital-synthesized areas of the integrated circuit 100.

In some embodiments, the integrated circuit 100 further includes other digital circuitry 103, which is some cases, is integrated within the processing core 101. In these embodiments, the integrated circuit 100 also supplies a reference clock (Ref$_{CLK}$), which may be generated on chip, may be generated by the processing core 101, or may be received by an off-chip clock generator. The embodiments of this disclosure are not limited by the actual source of the reference clock, which is generally available for the various components of the integrated circuit 100. In some embodiments, the integrated circuit 100 is a part of a network communication switch (or network adapter or the like) that includes a digital chip supply voltage and is configured to process network packets over one or more ports 10.

In at least some embodiments, the thermal sensor 102 includes a supply filter 105 to filter out noise coming from the integrated circuit 100 (e.g., from the processing core 101) by way of the digital chip supply voltage (VDD). While a basic design of the supply filter 105 is illustrated using a resistor and capacitor e.g., as a low-pass filter, additional passive or active fundamental components may be employed for purposes of filtering noise. The supply filter 105 may thus generate a filtered digital supply voltage that may be used to power various components of the thermal sensor 102, as illustrated.

In various embodiments, the thermal sensor 102 further includes a bandgap reference circuit 120, a voltage-to-frequency (VTF) readout circuit 125 implemented as a closed loop (e.g., a closed-loop readout circuit), a digital unit 190, and a clock generator 110. In some embodiments, the closed loop of the VTF readout circuit 125 includes sets of switched capacitors 130 coupled between the bandgap reference circuit 120 and an integrator 140, a loop filter 150 coupled to the integrator 140, a voltage controlled oscillator (VCO) 160 coupled to the loop filter 150, a clock divider 170 coupled to the VCO 160, and a clock generator 180 coupled between the clock divider 170 and the sets of switched capacitors 130. These various components will be discussed in more detail.

In some embodiments, the bandgap reference circuit 120 is configured to generate, from the digital chip supply voltage (e.g., from the filtered digital chip supply voltage), a static reference voltage (V$_{ref}$) and a proportional-to-absolute temperature (PTAT) voltage (illustrated as V$_{temp}$ for simplicity). For example, the PTAT voltage may be proportional to temperature and thus be useable to generate a frequency from which can derived the detected temperature value for the thermal sensor 102. In these embodiments, the static reference voltage is supplied to the integrator 140 for purposes of comparison with a feedback voltage (V$_{fb}$) generated by the sets of switched capacitors 130 while the PTAT voltage is supplied to a first bank of switched capacitors 132 of the sets of switched capacitors 130. In these embodiments, a second bank of switched capacitors 136 of the sets of switched capacitors 130 is coupled to the first bank of switched capacitors 132 and driven by a pair of clock signals (Ref$_{clkg}$) generated by the clock generator 110 from the reference clock (Ref$_{CLK}$).

In at least some embodiments, the integrator 140 generates an output based on a difference between the feedback voltage received from the switched capacitor 130 and the reference voltage received from the bandgap reference circuit 120. In these embodiments, the loop filter 150 includes an in-line resistor (R$_L$) and a filter capacitor (C$_L$) coupled between the in-line resistor and ground, operating as another low-pass filter and to generate a VCO control voltage (VCO$_{ctrl}$). In some embodiments, the loop voltage operates to generate a steady voltage due to the filter capacitor.

In some embodiments, this VCO control voltage drives the VCO 160 to generate a clock (Clk$_{VCO}$) with a period (or frequency) that is related to the VCO control voltage. In these embodiments, the clock divider 170 divides the VCO clock into a divided clock that is fed to the clock generator 180. In these embodiments, the clock generator 180 is configured to convert the divided clock into two pairs of differential clock signals that are also non-overlapping. In some embodiments, the capacitors of the first bank of switched capacitors 132 receive the PTAT voltage and are selectively controlled by the two pairs of differential clock signals.

In various embodiments, the digital unit 190 includes a digital counter 192 coupled to the clock generator 180. In some embodiments, the digital counter 192 generates a digital output (Dout) based on a number of cycles of the reference clock (Ref$_{clk}$) that fit into a cycle of the feedback clock (Clk$_{fb}$), the digital output being linearly proportional to a temperature on which the PTAT voltage is based. In some embodiments, the digital output is a digital word, e.g., a natural unit of data used by a particular processor design and may be a fixed-sized datum handled as a unit by the instruction set or the hardware of the digital circuitry 103 and/or the processing core 101.

Figure 2A:
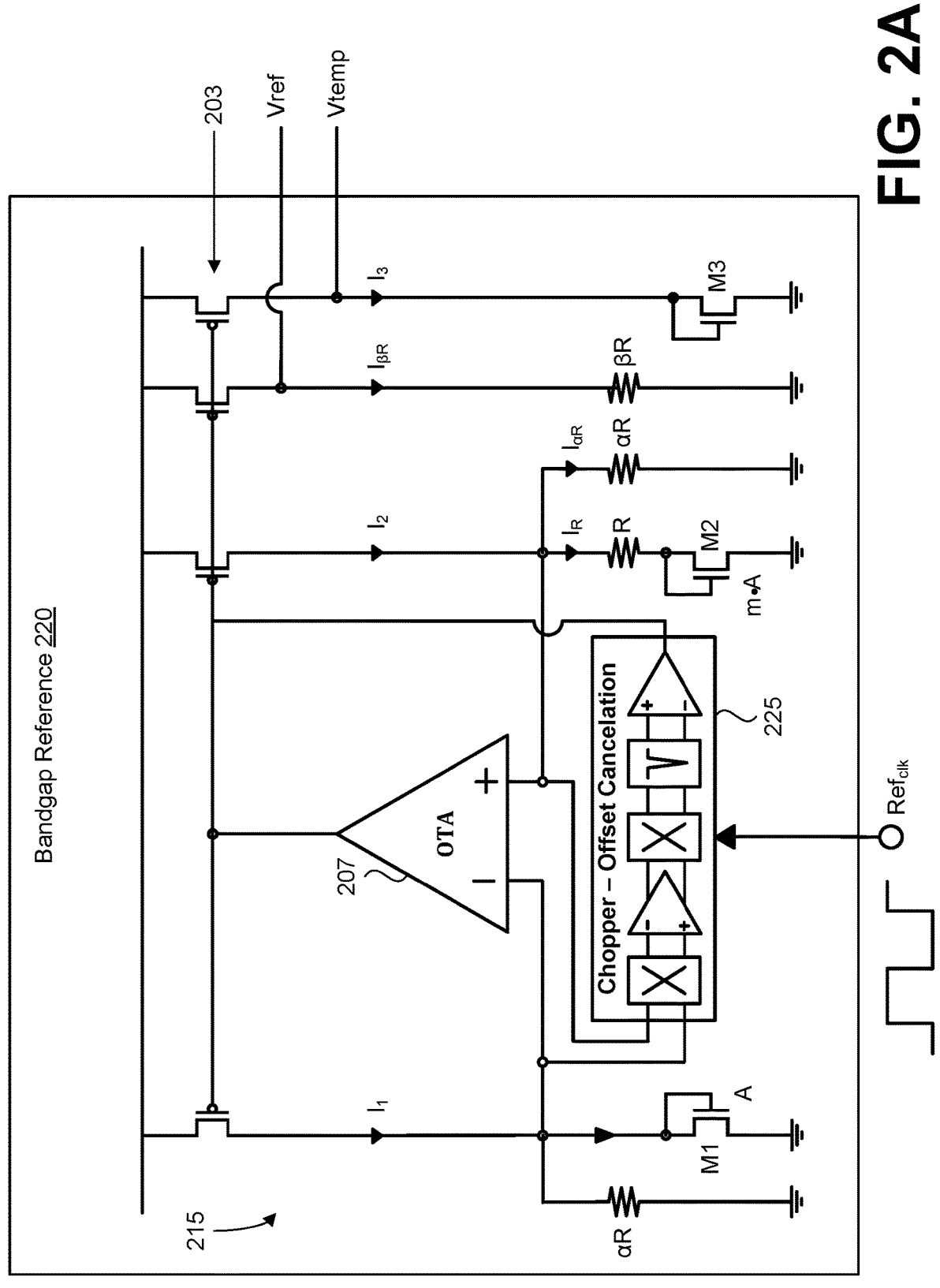
FIG. 2A is a schematic block diagram of a bandgap reference circuit for use in the digital-domain-based thermal sensor according to at least some embodiments.

FIG. 2A is a schematic block diagram of a bandgap reference circuit 220 for use in the digital-domain-based thermal sensor 102 according to at least some embodiments. In some embodiments, the bandgap reference circuit 220 is the bandgap reference circuit 120 of the thermal sensor 102 of FIG. 1.

In various embodiments, the bandgap reference circuit 220 includes a plurality of rail transistors 203 configured to operate in a sub-threshold region (rather than diodes, for example). In some embodiments, the bandgap reference circuit 220 includes an operational transconductance amplifier (OTA) 207 to control the plurality of rail transistors 203 and is coupled within a current mirror 215 formed by the plurality of rail transistors 203. In some embodiments, the OTA 207 is used for closing a feedback loop such that $V_{ap}=V_{an}$ and the sizing values of transistors and resistor are optimized for optimal process, voltage, temperature (PVT) operation.

In some embodiments, the bandgap reference circuit 220 includes a chopper circuit 225 coupled between terminals of the OTA 207 and gates of the plurality of rail transistors 203. In some embodiments, the chopper circuit 225 performs offset cancellation and is controlled by a reference clock ($Ref_{clkg}$) that also is used to control the second bank of switched capacitors 136 of the sets of switched capacitors 130 (FIG. 1).

In illustrated embodiments, the other fundamental electrical components are coupled as shown and are referred to below in a derivation of values for the reference voltage ($V_{ref}$) and the PTAT voltage ($V_{temp}$).

$$\begin{cases} I_1 = I_2 = I_3 = I_{\beta R} \\ V_{an} = V_{ap} \end{cases}$$

$$I_2 =$$

$$I_R + I_{\alpha R} = \frac{V_{GS_1} - V_{GS_2}}{R} + \frac{V_{GS_1}}{\alpha R} = \frac{V_T \ln\left(\frac{I_R}{I_{0,M_1}}\right) - V_T \ln\left(\frac{I_R}{I_{0,M_2}}\right)}{R} + \frac{V_{GS_1}}{\alpha R} =$$

$$\frac{V_T}{R}\ln\left(\frac{I_{0M_2}}{I_{0,M_1}}\right) + \frac{V_{GS_1}}{\alpha R} = \frac{V_T}{R}\ln(m) + \frac{V_{GS_1}}{\alpha R}$$

$$V_{ref} = I_{\beta R} \cdot \beta R = I_2 \cdot \beta R = \left[\frac{V_T}{R}\ln(m) + \frac{V_{GS_1}}{\alpha R}\right] \cdot \beta R = \frac{\beta}{\alpha}\left[\alpha V_T \ln(m) + V_{GS_1}\right]$$

$$V_{ref} = \frac{\beta}{\alpha}\left[\alpha V_T \ln(m) + V_{GS_1}\right] \text{ and } V_{temp} = V_T \ln(I_3) = V_T \ln\left(\frac{V_{ref}}{\beta R \cdot I_{0,M_3}}\right) \propto T$$

Figure 2B:
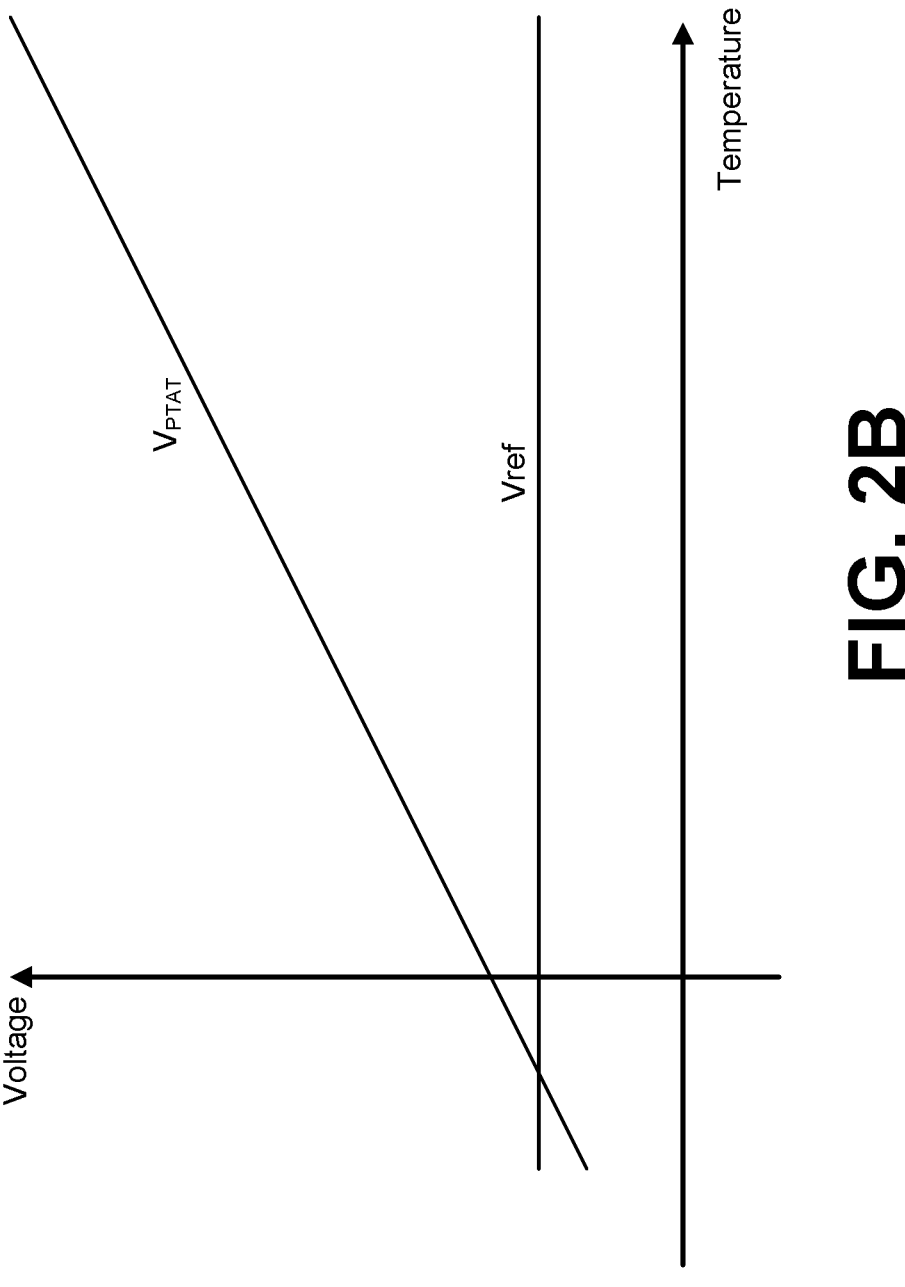
FIG. 2B is a graph that illustrates a relation between reference voltage (Vref) and a proportional to absolute temperature (PTAT) curve associated with the disclosed thermal sensor according to at least some embodiments.

FIG. 2B is a graph that illustrates a relation between reference voltage ($V_{ref}$) and a proportional to absolute temperature (PTAT) curve associated with the disclosed thermal sensor according to at least some embodiments. In these embodiments, it can be observed that the PTAT voltage (e.g., $V_{temp}$) acts linearly to temperature while the reference voltage ($V_{ref}$) stays static at a set voltage.

Figure 3A:
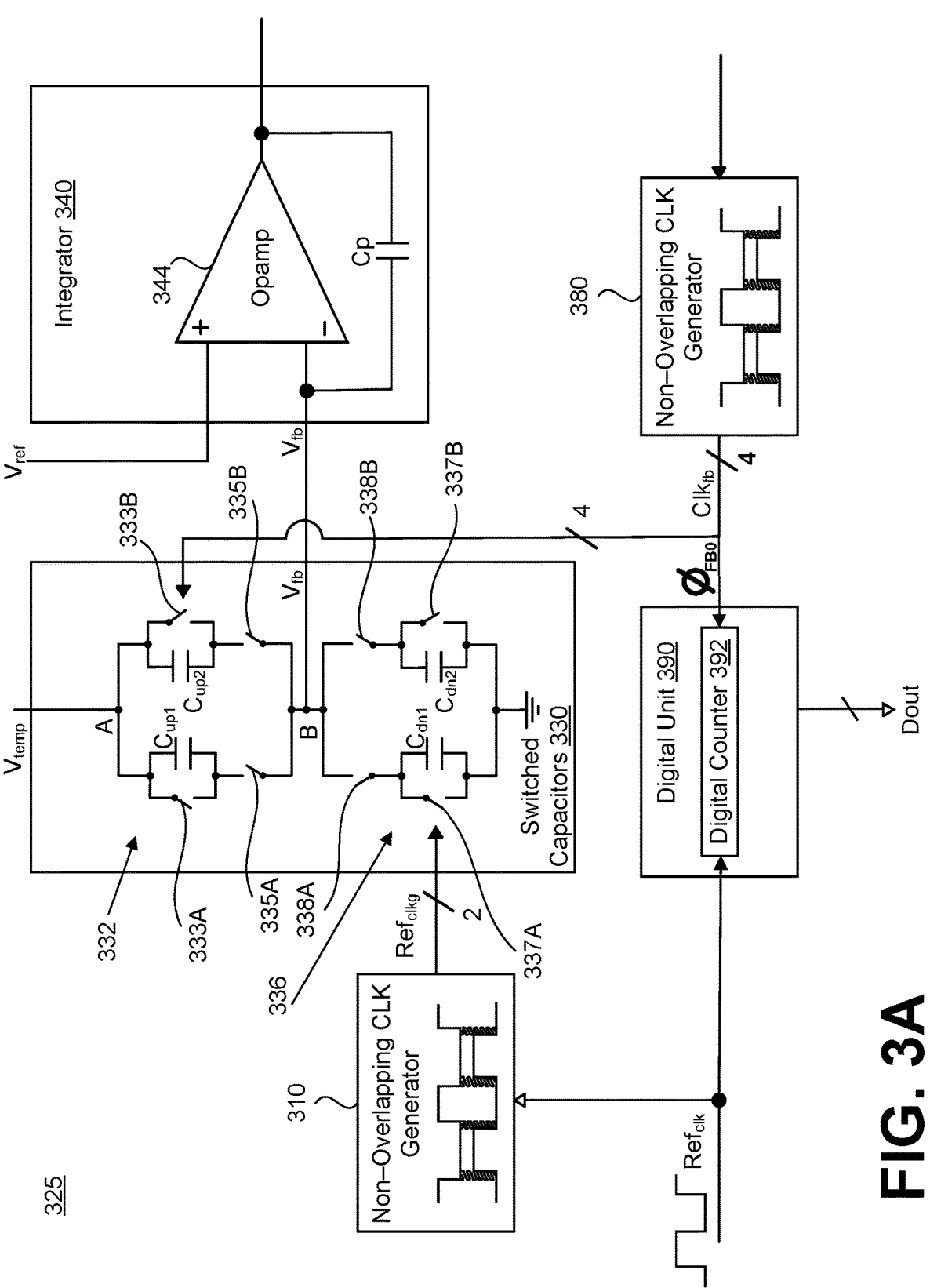
FIG. 3A is a schematic diagram of an exemplary partial voltage-to-frequency (VTF) readout circuit including sets of switched capacitors and an integrator acting on the voltage signals from the bandgap reference circuit and the sets of switched capacitors according to various embodiments.

FIG. 3A is a schematic diagram of an exemplary partial VTF readout circuit 325 including sets of switched capacitors 330 and an integrator 340 acting on the voltage signals from the bandgap reference circuit 120 (FIG. 1) and the sets of switched capacitors 330 according to various embodiments. In some embodiments, the partial VTF readout circuit 325 includes at least a portion of the VTF readout circuit 125 of FIG. 1.

In various embodiments, the partial VTF readout circuit 325 further includes a non-overlapping clock generator 310 (e.g., as an embodiment of the clock generator 110), a non-overlapping clock generator 380 (e.g., as an embodiment of the clock generator 180), and a digital unit 390 (e.g., as an embodiment of the digital unit 190) that includes a digital counter 392 (e.g., an embodiment of the digital counter 192). In these embodiments, the sets of switched capacitors 330 includes a first bank of switched capacitors 332 and a second bank of switched capacitors 336, where the first bank of switched capacitors 332 is coupled between nodes A and B and the second bank of switched capacitors 336 is coupled between node B and ground.

In at least some embodiments, a switched capacitor is used for creating a component that has average characteristics of a controlled resistor, e.g., having an average resistance that is inversely proportional to the frequency of its input clock. It can be shown that the charge flowing from a first (or positive) side to a second (or negative) side of the switched capacitor at a certain frequency determines an equivalent resistance that is proportional to one over the product of the capacitance and the operating frequency, e.g., expressed as:

$$R = \frac{1}{C \cdot f(clk)},$$

where the clock (clk) is controlling the switching of the switched capacitor. Thus, the switched capacitor (of the first bank of switched capacitors 332) can act, together with another switched capacitor (e.g., of the second bank of switched capacitors 336), as a voltage divider (typically implemented with resistors) on average over transitions of their respective clock signals. These switched capacitors can be selectively switched to vary resistance, and thus the sets of switched capacitors 130 and 330 are able to operate as a frequency-to-current converter with the feedback voltage ($V_{fb}$) as the output.

In these embodiments, the first bank of switched capacitors 332 includes a first up capacitor ($C_{up1}$) coupled in parallel with a switch 333A and in series to a switch 335A and includes a second up capacitor ($C_{up2}$) coupled in parallel with a switch 333B and in series with a switch 335B. In these embodiments, the first and second up capacitors are coupled in parallel and are thus each holds half the total capacitance ($C_{up}$) of the first bank of switched capacitors 332. In these embodiments, the PTAT voltage is fed to a top or first side of the first and second up capacitors, e.g., illustrated as node A in FIG. 3A.

In some embodiments, the second bank of switched capacitors 336 includes a first down capacitor ($C_{dn1}$) coupled in parallel to a switch 337 and in series to a switch 338A and includes a second down capacitor ($C_{dn2}$) coupled in parallel to a switch 337B and in series with a switch 338B. In these embodiments, the first and second down capacitors are coupled in parallel and thus each holds half the total capacitance ($C_{dn}$) of the second bank of switched capacitors 336. In some embodiments, the first and second down capacitors are coupled at a second end to ground (e.g., VSS).

In at least some embodiments, the switches 335A, 335B, 338A, and 338B are coupled on one side to a common node B located between the first and second banks of switched capacitors 332 and 336, where node B supplies the feedback voltage ($V_{fb}$) to the integrator 340. In these embodiments, the integrator 340 includes an operational amplifier 344 and an integrator capacitor (Cp) coupled between a negative terminal and an output of the operational amplifier 344. In some embodiments, the feedback voltage ($V_{fb}$) is supplied to the negative terminal of the operational amplifier 344 and the static reference voltage ($V_{ref}$) is supplied to a positive terminal of the operational amplifier 344. In this way, the output of the integrator 340 is an amplified difference between the feedback voltage and the static reference voltage, enabling the remainder of the VTF readout circuit 125 and 325 to operate on this voltage difference, starting with low pass filtration performed by the loop filter 150.

With additional reference to FIG. 1, while embodiments of the VCO 160 will be discussed in more detail, the VCO 160 generates a VCO clock ($Clk_{VCO}$) that encodes within its frequency, the temperature of the thermal sensor 102. In some embodiments, the clock divider 170 divides the VCO clock into a divided clock that is configured to drive the non-overlapping clock generator 380 in generating the feedback clock ($Clk_{fb}$) that was previously discussed. In various embodiments, the non-overlapping clock generator 380 is configured to convert the divided clock into two pairs of differential clock signals that are also non-overlapping. In some embodiments, the two pairs of differential clock signals selectively control the switches 335A and 335B coupled to the first and second up capacitors of the first bank of switched capacitors 332, as will be discussed in more detail with reference to FIGS. 3B-3D.

In various embodiments, the non-overlapping clock of the clock generator 180 or 380 prevents charge-sharing glitches between the first and second up capacitors and the differential signaling allows operation at a high frequency while the average equivalent resistance of the switched-capacitors remains the same. Hence, the design of the non-overlapping clock generator 380 can be used for relaxing the operation frequency and relaxing some design constraints and also using half of the capacitor size, which reduces the area used by the integrated circuit 100. For example, the differential signaling allows doubling the settling time of the sets of switched capacitors 330 while maintaining the same frequency of operation and the same equivalent resistance. Because the settling time is a limiter for the highest possible frequency of operation, the following design options are available. First, one may use the same frequency (with the same capacitor size) while maintaining the same equivalent resistance, but relaxing timing constraints. Second, one can employ twice the frequency with half the capacitor size while maintaining the same equivalent resistance. Finally, one may be employ twice the frequency with the same capacitor while reducing the average equivalent resistance by a factor of two.

In at least some embodiments, the reference clock ($Ref_{clk}$) that was previously discussed is supplied to both the digital counter 392 and the non-overlapping clock generator 310. In these embodiments, the non-overlapping clock generator 310 is configured to convert the reference clock into a pair of clock signals (e.g., as $Ref_{clkg}$) that are also non-overlapping. In some embodiments, the switches 337A and 337B of the second bank of switched capacitors 336 of the sets of switched capacitors 330 are controlled by the pair of clock signals, as will be discussed in more detail with reference to FIG. 3B and FIGS. 3E-3F.

In some embodiments, the voltage at Node A is determined by the PTAT voltage ($V_{temp}$) and the voltage at node B is determined by the reference voltage ($V_{ref}$), as the internal loop of the integrator 340 forces $V_{fb}=V_{ref}$. In these embodiments, in steady state operation, the output of the integrator 340 becomes constant on average, and therefore, the average current flow into the integrator capacitor (Cp) is zero. Hence, the average current flowing in the first bank of switched capacitors 332 (operating at the feedback frequency) trends towards being equal to the average current flowing in the second bank of switched capacitors 336 (operating at the reference frequency), which forces the feedback clock into a locked feedback frequency. In this way, the cycle time of the feedback clock (Tfb) is linear with temperature and the feedback frequency (f_fb) is inversely linear with temperature. The below mathematical formulation illustrates how the sets of switched capacitors 130 and 330 function to make this the case. Note that the expression being multiplied by $V_{temp}$ in the first $V_{fb}$ formulation is a voltage divider calculation.

$$V_{fb} = V_{ref}$$

$$V_{fb} = V_{temp} \cdot \cfrac{\cfrac{1}{C_{dn} \cdot f_{ref}}}{\cfrac{1}{C_{dn} \cdot f_{ref}} + \cfrac{1}{C_{up} \cdot f_{fb}}} = V_{temp} \cdot \frac{C_{up} \cdot f_{fb}}{C_{up} \cdot f_{fb} + C_{dn} \cdot f_{ref}} = V_{ref}$$

$$V_{temp} \cdot C_{up} \cdot f_{fb} = V_{ref}(C_{up} \cdot f_{fb} + C_{dn} \cdot f_{ref})$$

$$C_{up} \cdot f_{fb} \cdot (V_{temp} - V_{ref}) = C_{dn} \cdot f_{ref} \cdot V_{ref}$$

$$f_{fb} = \frac{c_{dn}}{C_{up}} \cdot \frac{V_{ref}}{V_{temp} - V_{ref}} \cdot f_{ref} \cdot V_{ref}$$

$$T_{fb} = T_{ref} \cdot \frac{C_{up}}{c_{dn}} \cdot \left( \frac{V_{temp}}{V_{ref}} - 1 \right)$$

As illustrated in the Tfb expression that results, in these embodiments, the period of the feedback clock ($Clk_{fb}$) is directly proportional to the PTAT voltage ($V_{temp}$), which is linear with temperature, and inversely proportional to the reference voltage ($V_{ref}$).

Figure 3B:
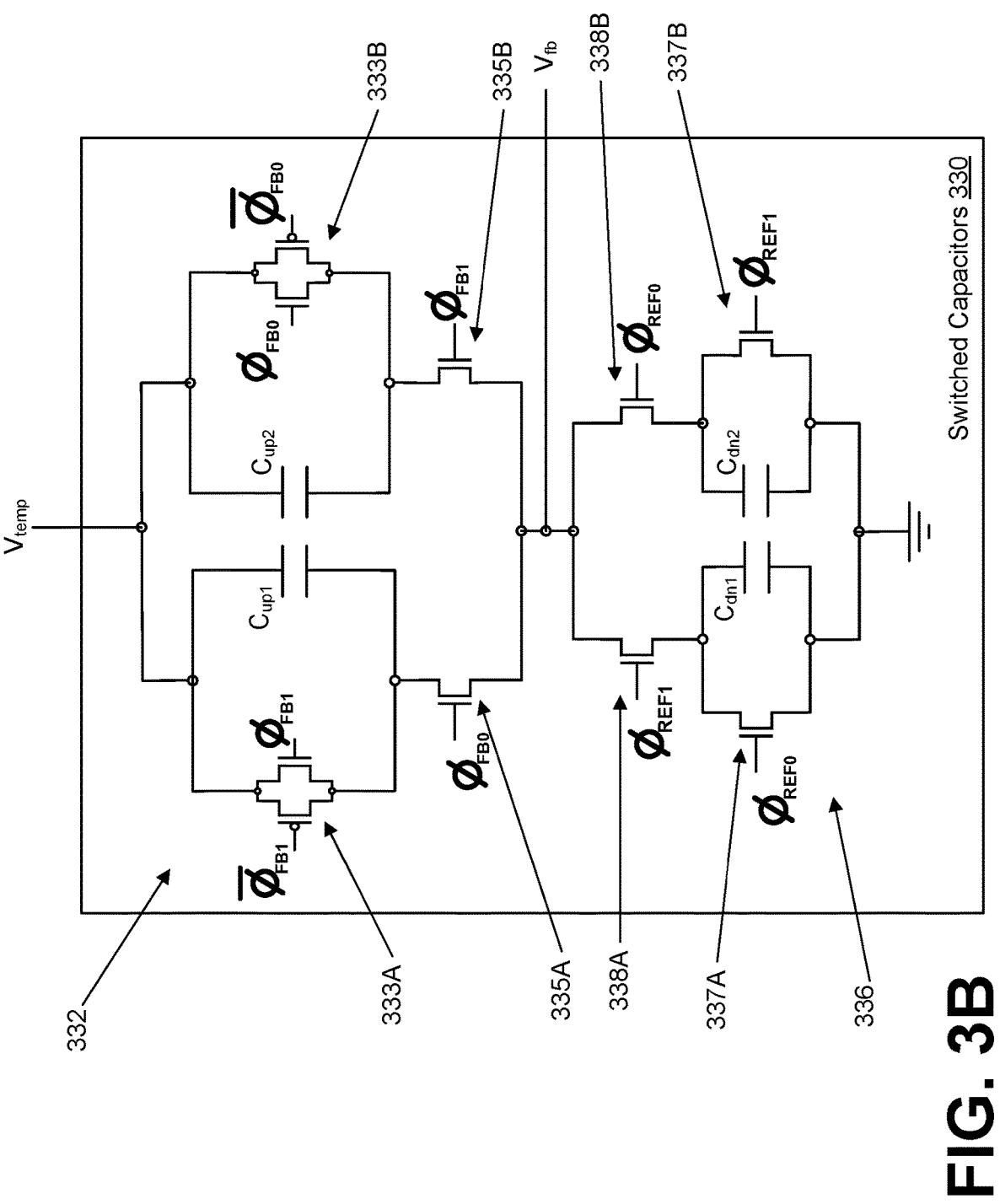
FIG. 3B is a detailed schematic diagram of a further design for the sets of switched capacitors including associated feedback and reference signals driving the switches coupled to the capacitors according to some embodiments.

FIG. 3B is a detailed schematic diagram of a further design for the sets of switched capacitors 330 including associated feedback and reference signals driving the switches coupled to the capacitors according to some embodiments. In at least some embodiments, the switches 333A and 333B of the first bank of switched capacitors 332 are each made up of a parallelly coupled pair of metal-oxide semiconductor field-effect transistors (MOSFET), e.g., one each of an NMOS transistor and a PMOS transistor. In these embodiments, the NMOS transistor of the switch 333B is controlled by a first clock signal ($\emptyset_{FB0}$) and the PMOS transistor of the switch 333B is controlled by an inverted first clock signal ($\overline{\emptyset}_{FB0}$) of the feedback clock. In these embodiments, the NMOS transistor of the switch 333A is controlled by a second clock signal ($\emptyset_{FB1}$) and the PMOS transistor of the switch 333A is controlled by an inverted second clock signal ($\overline{\emptyset}_{FB1}$). In these embodiments, the first clock signal also controls the switch 335A and the second clock signal also controls the switch 335B.

Figures 3C, 3D:
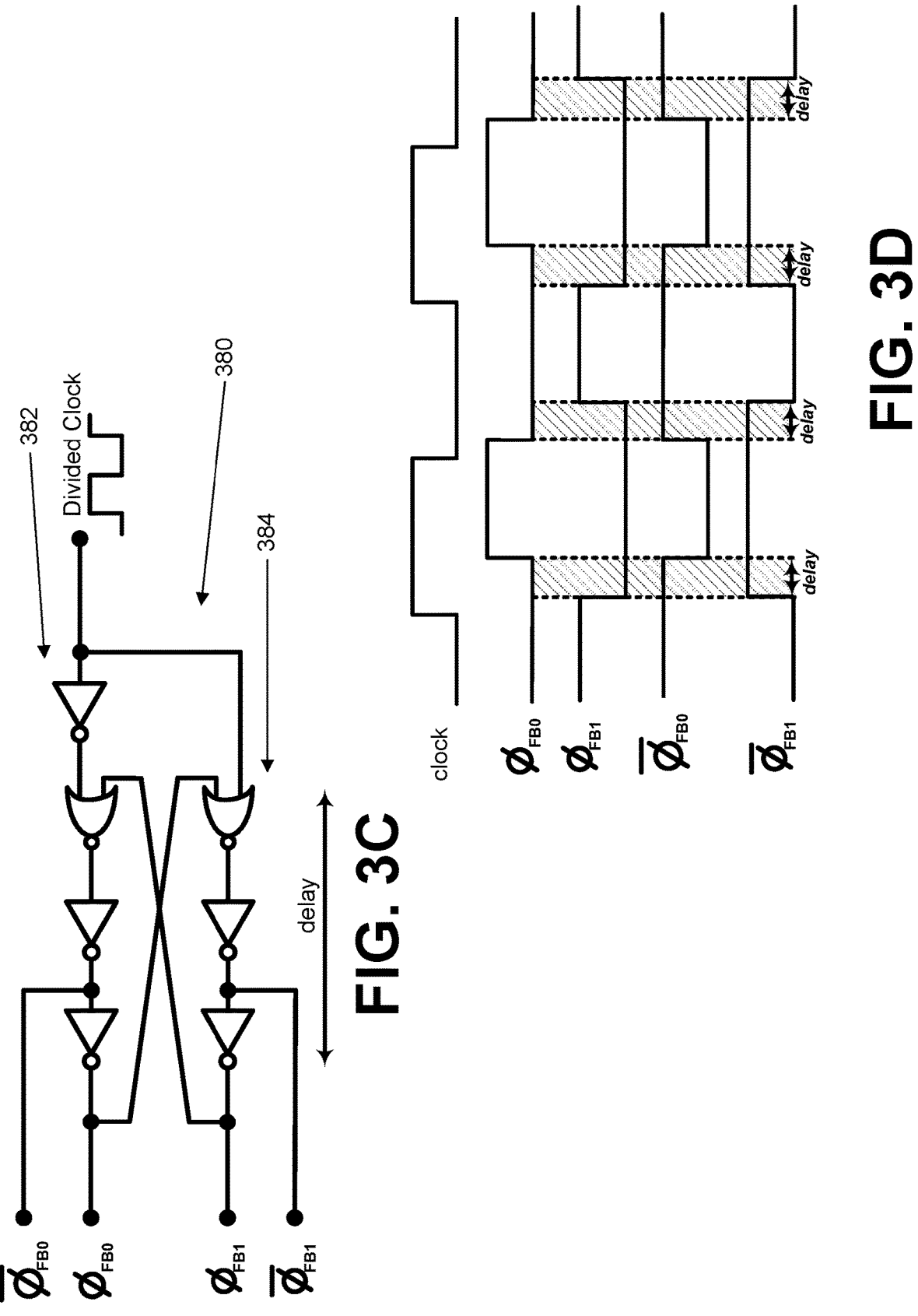
FIGS. 3C-3D are a circuit design and related signals graph, respectively, for the non-overlapping clock generator in the feedback loop of the digital-domain-based thermal sensor according to some embodiments.

FIGS. 3C-3D are a circuit design and related signals graph, respectively, for the non-overlapping clock generator 180 and 380 in the feedback loop of the digital-domain-based thermal sensor 102 according to some embodiments. In various embodiments, and with reference to FIG. 3C, the non-overlapping clock generator 380 includes a string of inverters with an XNOR for each differential pair of clock signals, e.g., a first string of inverters 382 to generate a first pair of differential clock signals $\emptyset_{FB0}$, $\overline{\emptyset}_{FB0}$ and a second string of inverters 384 to generate a second pair of differential clock signals $\emptyset_{FB1}$, $\overline{\emptyset}_{FB1}$. In some embodiments, each XNOR gate also receives an output of the clock signal of the other pair of differential clock signals, e.g., $\varnothing_{FB1}$ at the XNOR gate for the first pair of differential clock signals and $\varnothing_{FB0}$ at the XNOR gate for the second pair of differential clock signals.

Further, in these embodiments, the string of inverters include some inverters to create a delay between clock signals within each respective pair of differential clock signals, e.g., a delay between the second pair of differential clock signals $\varnothing_{FB1}$ and $\overline{\varnothing}_{FB1}$ and the first pair of differential clock signals $\varnothing_{FB0}$ and $\overline{\varnothing}_{FB0}$. As illustrated in FIG. 3C, this delay causes the clock signals within each respective pair of differential clock signals to be non-overlapping, the advantage for which was already discussed. Thus, in some embodiments, these pair of non-overlapping clock signals are at the same frequency, but are fully differential, e.g., one clock signal of the pair of clock signals is positive while the other clock signal of the pair of clock signals is negative and operating on the rising and falling edges of the clock. In some embodiments, this prevents charge sharing from top to bottom of the design except for when the switching intends the charge to be transferred, as will be explained.

With additional reference to FIG. 3B, the switches 337A and 337B are NMOS transistors. In these embodiments, the non-overlapping clock generator 310 generates a pair of reference clock signals ($\varnothing_{REF0}$, $\varnothing_{REF1}$) to respective control the switches 337B and 337A, but need not be differential because the switches 337A and 337B may not also include PMOS transistors.

Figures 3E, 3F:
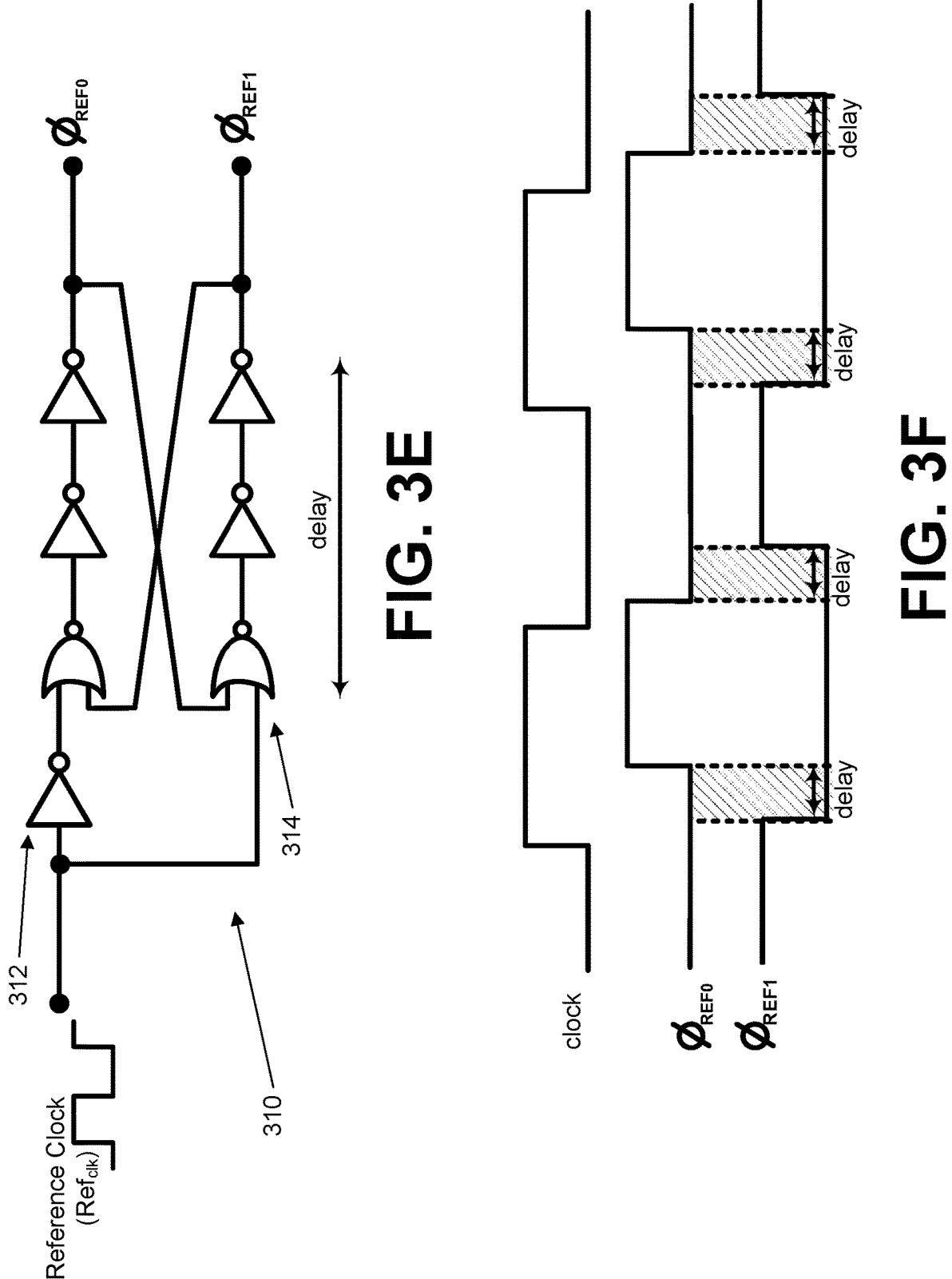
FIGS. 3E-3F are a circuit design and related signals graph, respectively, for the non-overlapping clock generator that generates a reference voltage for the digital-domain-based thermal sensor according to some embodiments.

FIGS. 3E-3F are a circuit design and related signals graph, respectively, for the non-overlapping clock generator 110 and 310 that generates a reference voltage (Ref$_{clkg}$) for the digital-domain-based thermal sensor according to some embodiments. In these embodiments, the non-overlapping clock generator 310 illustrated in FIG. 3E generates the pair of clock signals that are non-overlapping, e.g., generated reference clock signals $\varnothing_{REF0}$, $\varnothing_{REF1}$ discussed with reference to FIG. 3B. In some embodiments, the non-overlapping clock generator 310 is configured (similar to the non-overlapping clock generator 380) with a series of inverters 312 with an XNOR gate to generate a first reference clock signal ($\varnothing_{REF0}$) and a series of inverters 314 with an XNOR gate to generate a second reference clock signal ($\varnothing_{REF1}$). For the non-overlapping clock generator 310, however, the differential clock signals may not be needed.

Further, in these embodiments, each string of inverters include some inverters to create a delay between the reference clock signals within each respective pair of reference clock signals, e.g., a delay between the second reference clock signal $\varnothing_{REF1}$ and the first reference clock signal $\overline{\varnothing}_{REF1}$. As illustrated in FIG. 3C, this delay causes the clock signals of the pair of clock signals to be non-overlapping, the advantage for which was already discussed.

In various embodiments, the clock generation of the pairs of differential clocks signals illustrated in FIG. 3D and the pair of reference clocks signals illustrated in FIG. 3E operate to close one of the switches 333A and 333B (including one of the switches 335A or 335B) to charge the up capacitor ($C_{up}$), and in the next cycle, transfer this charge to the down capacitor ($C_{dn}$) of the sets of switched capacitors. In these embodiments, this capacitive-only approach in terms of tracking voltage changes related to temperature change, enables the VTF readout circuits 125 and 325 to operate with no dependencies on resistors and rely primarily on the input reference clock (Ref$_{clk}$), which is integrated into those areas of the chip for other purposes, e.g., the ability to reuse the reference clock that is already available. The reference clock can thus be understood as a constant in the math performed to derive the temperature, e.g., as the digital word (Dout) by the digital unit 390. Specifically, since this reference clock is used in the digital counter 392 and the digital word represents the ratio between the cycle time of the feedback clock and the reference clock, the reference clock can be understood as constant in the mathematical expression. Even if the VTF readout circuit 125 or 325 were using an internal oscillator with non-constant cycle time (which changes with production corner and temperature), as long as the digital word represents the ratio of cycle times of the feedback and reference clocks (fb_clk & ref_clk), the reference clock can be understood as constant.

In these embodiments, employing the switched-capacitors structure of the thermal sensor 102 enables mitigation of tracking temperature due to capacitors having negligible temperature coefficients and that the operation point of the thermal sensor 102 is based on matching capacitance of capacitors that have small variations. Capacitors also consume a smaller chip area compared to resistors.

Figure 4A:
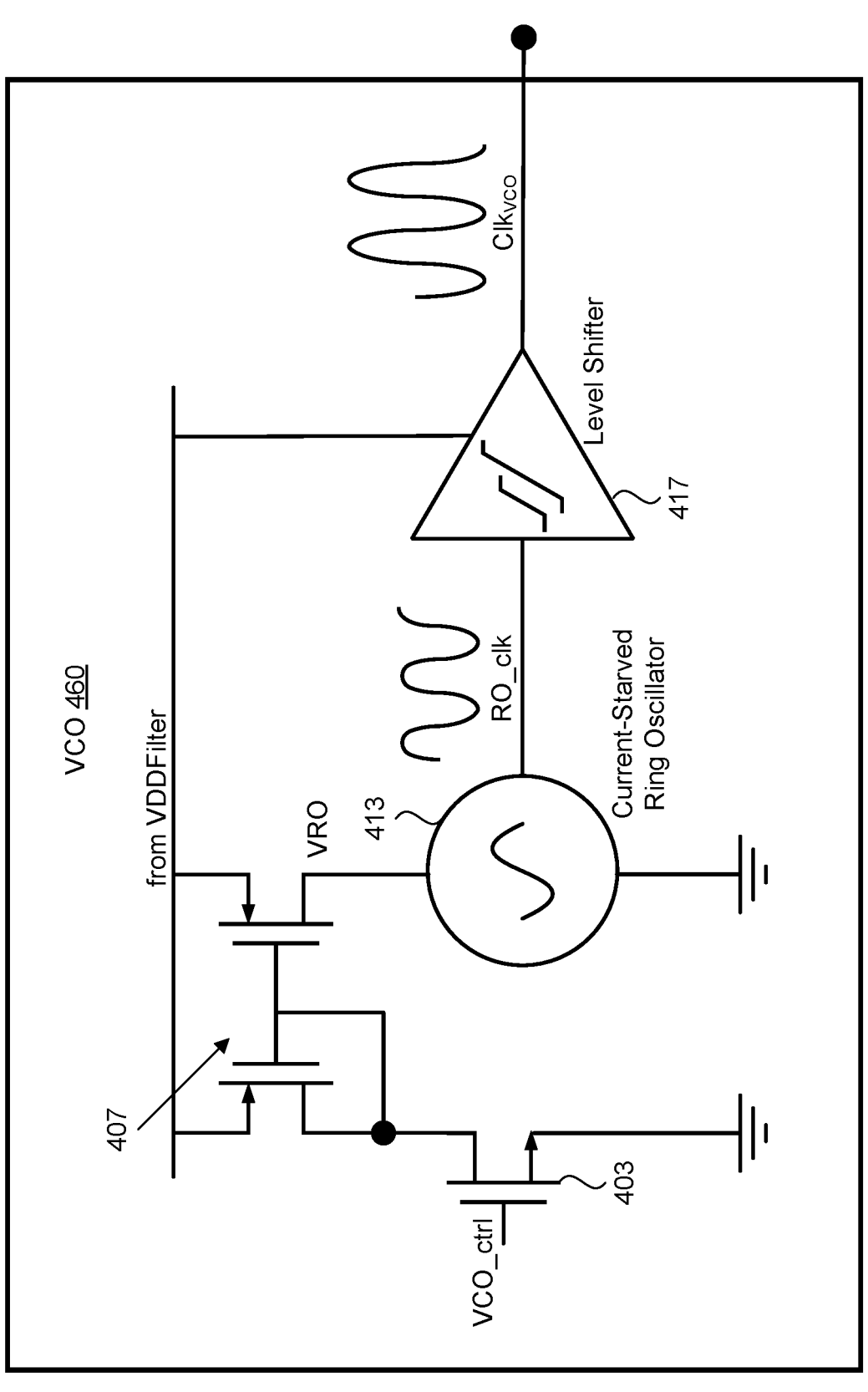
FIG. 4A is a schematic block diagram of an example voltage controlled oscillator (VCO) of the digital-domain-based thermal sensor according to at least some embodiments.

FIG. 4A is a schematic block diagram of an example voltage controlled oscillator (VCO) 460 of the digital-domain-based thermal sensor 102 according to at least some embodiments. Thus, in some embodiments, the VCO 460 is the VCO 160 of FIG. 1. In various embodiments, the VCO 460 includes an input transistor 403 (e.g., an NMOS transistor) to receive a filtered feedback voltage from the loop filter 150 and a current-starved ring oscillator 413 that generates an RO-generated clock (RO_clk).

In some embodiments, the VCO 460 further includes a current mirror 407 coupled between the input transistor 403 and the current-starved ring oscillator. The current mirror 407 can level-shift up the filtered feedback voltage (e.g., the RO_clk) to generate a level-shifted voltage. Thus, in these embodiments, the larger the input, filtered feedback voltage, the larger the ring oscillator output frequency. In some embodiments, the output frequency of the ring oscillator 413 is monotonous; the generated current and the local supply for the ring oscillator 413 has a much larger headroom. In these embodiments, using the current mirror 407 enables output of an average frequency VCO output clock (VCO-_clk) in steady state. Those skilled in the art will appreciate the current mirror 407 also obviates the need for a voltage supply regulator, which if employed, can create design constraints and possible performance degradation of the integrator 340 and/or the VCO 460.

In some embodiments, the VCO 460 also includes a rail-to-rail amplifier 417 coupled to an output of the current-starved ring oscillator 413. In some embodiments, the rail-to-rail amplifier 417 operates as a level shifter to level-shift up the output to generate the VCO clock (Clk$_{VCO}$), thus resolving any voltage swing issues at the output of the VCO 460.

Figure 4B:
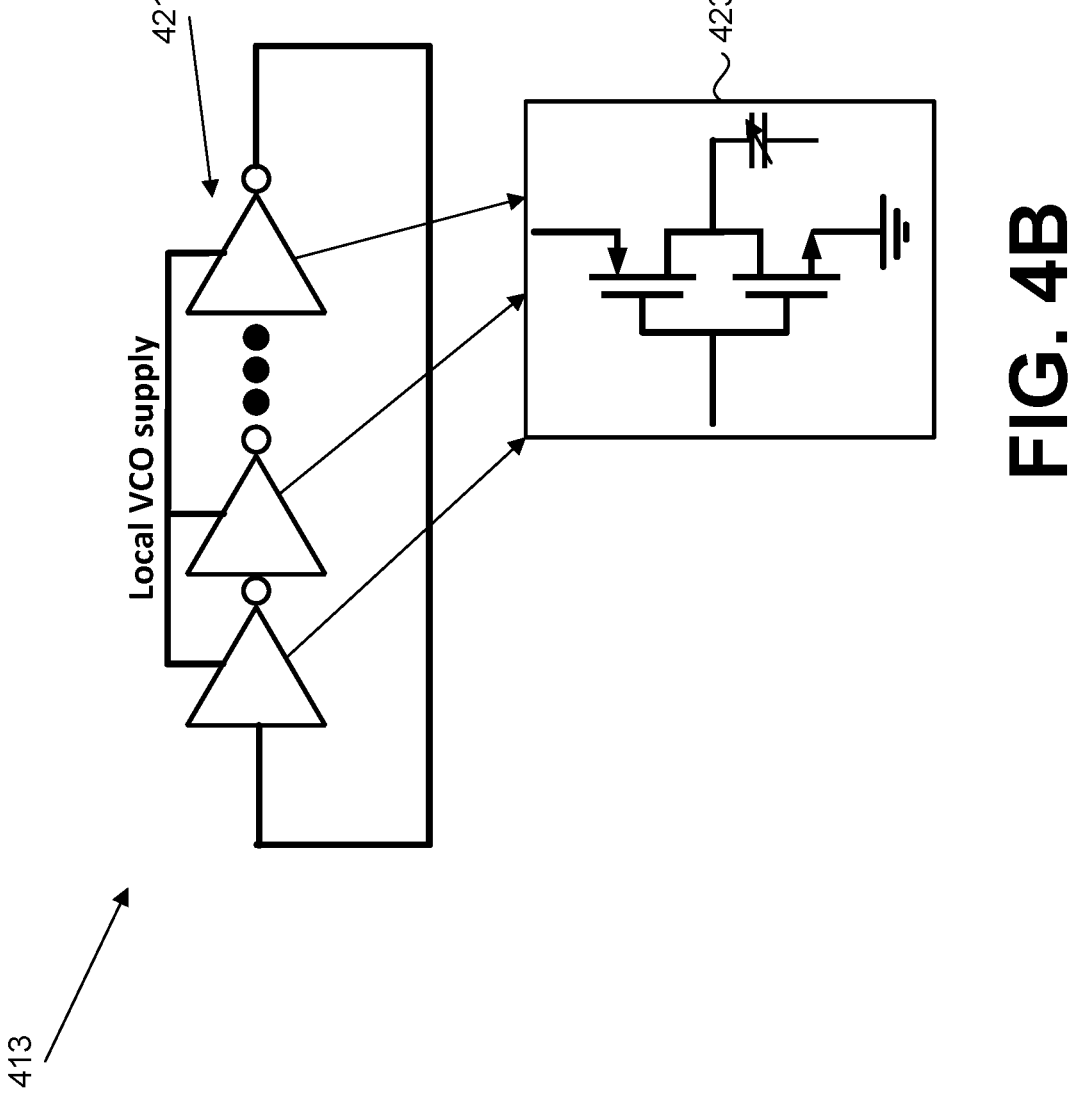
FIG. 4B is a circuit design of an exemplary the current-starved ring oscillator of FIG. 4A according to some embodiments.

FIG. 4B is a circuit design of an exemplary the current-starved ring oscillator 413 of FIG. 4A according to some embodiments. In some embodiments, the current-starved ring oscillator 413 includes multiple inverter stages 421 (odd in number), each including a variable-controlled capacitor 423, that are configurable to control a gain of the VCO 460. For example, the delay of at some of the variable-controlled capacitors 423 can be adjusted to control overall timing of the VCO clock. In some embodiments, each variable-controlled capacitor 423 is a variable-controlled MOS capacitor.

Other variations are within the scope of the present disclosure. Thus, while disclosed techniques are susceptible to various modifications and alternative constructions, certain illustrated embodiments thereof are shown in drawings and have been described above in detail. It should be understood, however, that there is no intention to limit the disclosure to a specific form or forms disclosed, but on the contrary, the intention is to cover all modifications, alternative constructions, and equivalents falling within the spirit and scope of the disclosure, as defined in appended claims.

Use of terms "a" and "an" and "the" and similar referents in the context of describing disclosed embodiments (especially in the context of following claims) are to be construed to cover both singular and plural, unless otherwise indicated herein or clearly contradicted by context, and not as a definition of a term. Terms "comprising," "having," "including," and "containing" are to be construed as open-ended terms (meaning "including, but not limited to,") unless otherwise noted. "Connected," when unmodified and referring to physical connections, is to be construed as partly or wholly contained within, attached to, or joined together, even if there is something intervening. Recitations of ranges of values herein are merely intended to serve as a shorthand method of referring individually to each separate value falling within the range, unless otherwise indicated herein, and each separate value is incorporated into the specification as if it were individually recited herein. In at least one embodiment, the use of the term "set" (e.g., "a set of items") or "subset" unless otherwise noted or contradicted by context, is to be construed as a nonempty collection comprising one or more members. Further, unless otherwise noted or contradicted by context, the term "subset" of a corresponding set does not necessarily denote a proper subset of the corresponding set, but subset and corresponding set may be equal.

Conjunctive language, such as phrases of the form "at least one of A, B, and C," or "at least one of A, B and C," unless specifically stated otherwise or otherwise clearly contradicted by context, is otherwise understood with the context as used in general to present that an item, term, etc., may be either A or B or C, or any nonempty subset of the set of A and B and C. For instance, in an illustrative example of a set having three members, conjunctive phrases "at least one of A, B, and C" and "at least one of A, B and C" refer to any of the following sets: {A}, {B}, {C}, {A, B}, {A, C}, {B, C}, {A, B, C}. Thus, such conjunctive language is not generally intended to imply that certain embodiments require at least one of A, at least one of B and at least one of C each to be present. In addition, unless otherwise noted or contradicted by context, the term "plurality" indicates a state of being plural (e.g., "a plurality of items" indicates multiple items). In at least one embodiment, the number of items in a plurality is at least two, but can be more when so indicated either explicitly or by context. Further, unless stated otherwise or otherwise clear from context, the phrase "based on" means "based at least in part on" and not "based solely on."

Operations of processes described herein can be performed in any suitable order unless otherwise indicated herein or otherwise clearly contradicted by context. In at least one embodiment, a process such as those processes described herein (or variations and/or combinations thereof) is performed under control of one or more computer systems configured with executable instructions and is implemented as code (e.g., executable instructions, one or more computer programs or one or more applications) executing collectively on one or more processors, by hardware or combinations thereof. In at least one embodiment, code is stored on a computer-readable storage medium, for example, in the form of a computer program comprising a plurality of instructions executable by one or more processors. In at least one embodiment, a computer-readable storage medium is a non-transitory computer-readable storage medium that excludes transitory signals (e.g., a propagating transient electric or electromagnetic transmission) but includes non-transitory data storage circuitry (e.g., buffers, cache, and queues) within transceivers of transitory signals. In at least one embodiment, code (e.g., executable code or source code) is stored on a set of one or more non-transitory computer-readable storage media having stored thereon executable instructions (or other memory to store executable instructions) that, when executed (i.e., as a result of being executed) by one or more processors of a computer system, cause a computer system to perform operations described herein. In at least one embodiment, a set of non-transitory computer-readable storage media comprises multiple non-transitory computer-readable storage media and one or more of individual non-transitory storage media of multiple non-transitory computer-readable storage media lack all of the code while multiple non-transitory computer-readable storage media collectively store all of the code. In at least one embodiment, executable instructions are executed such that different instructions are executed by different processors.

Accordingly, in at least one embodiment, computer systems are configured to implement one or more services that singly or collectively perform operations of processes described herein and such computer systems are configured with applicable hardware and/or software that enable the performance of operations. Further, a computer system that implements at least one embodiment of present disclosure is a single device and, in another embodiment, is a distributed computer system comprising multiple devices that operate differently such that distributed computer system performs operations described herein and such that a single device does not perform all operations.

Use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

All references, including publications, patent applications, and patents, cited herein are hereby incorporated by reference to the same extent as if each reference were individually and specifically indicated to be incorporated by reference and were set forth in its entirety herein.

In description and claims, terms "coupled" and "connected," along with their derivatives, may be used. It should be understood that these terms may not be intended as synonyms for each other. Rather, in particular examples, "connected" or "coupled" may be used to indicate that two or more elements are in direct or indirect physical or electrical contact with each other. "Coupled" may also mean that two or more elements are not in direct contact with each other, but yet still co-operate or interact with each other.

Unless specifically stated otherwise, it may be appreciated that throughout specification terms such as "processing," "computing," "calculating," "determining," or like, refer to action and/or processes of a computer or computing system, or similar electronic computing device, that manipulate and/or transform data represented as physical, such as electronic, quantities within computing system's registers and/or memories into other data similarly represented as physical quantities within computing system's memories, registers or other such information storage, transmission or display devices.

In a similar manner, the term "processor" may refer to any device or portion of a device that processes electronic data from registers and/or memory and transform that electronic data into other electronic data that may be stored in registers and/or memory. As non-limiting examples, a "processor" may be a network device or a MACsec device. A "computing platform" may comprise one or more processors. As used herein, "software" processes may include, for example, software and/or hardware entities that perform work over time, such as tasks, threads, and intelligent agents. Also, each process may refer to multiple processes, for carrying out instructions in sequence or in parallel, continuously or intermittently. In at least one embodiment, terms "system" and "method" are used herein interchangeably insofar as the system may embody one or more methods and methods may be considered a system.

In the present document, references may be made to obtaining, acquiring, receiving, or inputting analog or digital data into a sub-system, computer system, or computer-implemented machine. In at least one embodiment, the process of obtaining, acquiring, receiving, or inputting analog and digital data can be accomplished in a variety of ways such as by receiving data as a parameter of a function call or a call to an application programming interface. In at least one embodiment, processes of obtaining, acquiring, receiving, or inputting analog or digital data can be accomplished by transferring data via a serial or parallel interface. In at least one embodiment, processes of obtaining, acquiring, receiving, or inputting analog or digital data can be accomplished by transferring data via a computer network from providing entity to acquiring entity. In at least one embodiment, references may also be made to providing, outputting, transmitting, sending, or presenting analog or digital data. In various examples, processes of providing, outputting, transmitting, sending, or presenting analog or digital data can be accomplished by transferring data as an input or output parameter of a function call, a parameter of an application programming interface or inter-process communication mechanism.

Although descriptions herein set forth example embodiments of described techniques, other architectures may be used to implement described functionality, and are intended to be within the scope of this disclosure. Furthermore, although specific distributions of responsibilities may be defined above for purposes of description, various functions and responsibilities might be distributed and divided in different ways, depending on circumstances.

Furthermore, although the subject matter has been described in language specific to structural features and/or methodological acts, it is to be understood that subject matter claimed in appended claims is not necessarily limited to specific features or acts described. Rather, specific features and acts are disclosed as exemplary forms of implementing the claims.

What is claimed is:

1. An integrated circuit comprising:
   a bandgap reference circuit configured to generate, from a digital chip supply voltage, a reference voltage and a proportional-to-absolute temperature (PTAT) voltage; and
   a voltage-to-frequency (VTF) readout circuit to receive the reference voltage and the PTAT voltage as inputs, wherein the VTF readout circuit comprises:
   sets of switched capacitors that operate as a voltage divider, wherein one or more capacitors of the sets of switched capacitors are selectively charged by the PTAT voltage via first switches of the sets of switched capacitors to generate a feedback voltage, and wherein the one or more capacitors being selectively charged operate as a frequency-to-current converter;
   a voltage-controlled oscillator (VCO) driven by a difference between the feedback voltage and the reference voltage and to generate a VCO clock; and
   a clock generator to generate a feedback clock based on the VCO clock, wherein the first switches of the sets of switched capacitors are controlled by the feedback clock.

2. The integrated circuit of claim 1, further comprising a digital counter coupled to the clock generator, the digital counter to generate a digital output based on a number of cycles of a reference clock that fit into a cycle of the feedback clock, the digital output being linearly proportional to a temperature on which the PTAT voltage is based.

3. The integrated circuit of claim 1, wherein the VTF readout circuit is implemented as a closed loop and further comprises an integrator coupled to the sets of switched capacitors, the integrator comprising:
   an operational amplifier that receives the reference voltage at a negative terminal and the feedback voltage at a positive terminal; and
   an integrator capacitor coupled between the negative terminal and an output of the operational amplifier.

4. The integrated circuit of claim 3, wherein the VTF readout circuit further comprises a loop filter coupled between the integrator and the VCO, the loop filter comprising an in-line resistor and a filter capacitor coupled between the in-line resistor and ground.

5. The integrated circuit of claim 1, wherein the VCO comprises:
   an input transistor to receive a filtered feedback voltage;
   a current-starved ring oscillator;
   a current mirror coupled between the input transistor and the current-starved ring oscillator, the current mirror to level-shift up the filtered feedback voltage; and
   a rail-to-rail amplifier coupled to an output of the current-starved ring oscillator, the rail-to-rail amplifier to level-shift up the output to generate the VCO clock.

6. The integrated circuit of claim 5, wherein the current-starved ring oscillator comprises a plurality of inverter stages, each comprising a variable-controlled capacitor, that are configurable to control a gain of the VCO.

7. The integrated circuit of claim 1, wherein the VTF readout circuit further comprises a clock divider coupled to an output of the VCO, the clock divider to divide the VCO clock into a divided clock, wherein the clock generator is a first clock generator configured to convert the divided clock into two pairs of differential clock signals that are also non-overlapping, and wherein capacitors of a first bank of switched capacitors receive the PTAT voltage and are selectively controlled by the two pairs of differential clock signals.

8. The integrated circuit of claim 7, wherein the VTF readout circuit further comprises a second clock generator configured to convert a reference clock into a pair of clock signals that are also non-overlapping, wherein switches of a second bank of switched capacitors of the sets of switched capacitors are controlled by the pair of clock signals.

9. The integrated circuit of claim 1, wherein the first switches are part of a first bank of switched capacitors, and wherein the bandgap reference circuit comprises:
   a plurality of rail transistors configured to operate in a sub-threshold region;

an operational transconductance amplifier (OTA) to control the plurality of rail transistors and coupled within a current mirror formed by the plurality of rail transistors; and a chopper circuit coupled between terminals of the OTA and gates of the plurality of rail transistors, the chopper circuit controlled by a reference clock also used to control a second bank of switched capacitors of the sets of switched capacitors.

10. A digital-domain-based thermal sensor comprising:

a filter to filter a digital chip supply voltage into a filtered digital supply voltage;

a bandgap reference circuit configured to generate, from the filtered digital supply voltage, a reference voltage and a proportional-to-absolute temperature (PTAT) voltage; and a closed-loop readout circuit coupled to the bandgap reference circuit and comprising:

sets of switched capacitors that operate as a voltage divider, wherein capacitors of the sets of switched capacitors are selectively charged by the PTAT voltage and generate a feedback voltage;

a voltage-controlled oscillator (VCO) driven by a difference between the feedback voltage and the reference voltage and to generate a VCO clock; and a clock generator to generate a feedback clock based on the VCO clock, wherein first switches of the sets of switched capacitors are controlled by the feedback clock; and a digital counter coupled to the clock generator, the digital counter to generate a digital output based on a number of cycles of a reference clock that fit into a cycle of the feedback clock.

11. The digital-domain-based thermal sensor of claim 10, wherein the closed-loop readout circuit further comprises an integrator coupled to the sets of switched capacitors, the integrator comprising:

an operational amplifier that receives the reference voltage at a negative terminal and the feedback voltage at a positive terminal; and an integrator capacitor coupled between the negative terminal and an output of the operational amplifier.

12. The digital-domain-based thermal sensor of claim 11, wherein the closed-loop readout circuit further comprises a loop filter coupled between the integrator and the VCO, the loop filter comprising an in-line resistor and a filter capacitor coupled between the in-line resistor and ground.

13. The digital-domain-based thermal sensor of claim 10, wherein the VCO comprises:

an input transistor to receive a filtered feedback voltage;

a current-starved ring oscillator;

a current mirror coupled between the input transistor and the current-starved ring oscillator, the current mirror to level-shift up the filtered feedback voltage; and a rail-to-rail amplifier coupled to an output of the current-starved ring oscillator, the rail-to-rail amplifier to level-shift up the output to generate the VCO clock.

14. The digital-domain-based thermal sensor of claim 13, wherein the current-starved ring oscillator comprises a plurality of inverter stages, each comprising a variable-controlled capacitor, that are configurable to control a gain of the VCO.

15. The digital-domain-based thermal sensor of claim 10, wherein the closed-loop readout circuit further comprises a clock divider coupled to an output of the VCO, the clock divider to divide the VCO clock into a divided clock, wherein the clock generator is a first clock generator configured to convert the divided clock into two pairs of differential clock signals that are also non-overlapping, and wherein capacitors of a first bank of switched capacitors receive the PTAT voltage and are selectively controlled by the two pairs of differential clock signals.

16. The digital-domain-based thermal sensor of claim 15, wherein the closed-loop readout circuit further comprises a second clock generator configured to convert a reference clock into a pair of clock signals that are also non-overlapping, wherein a second bank of switched capacitors of the sets of switched capacitors is controlled by the pair of clock signals.

17. The digital-domain-based thermal sensor of claim 10, wherein the first switches are part of a first bank of switched capacitors, and wherein the bandgap reference circuit comprises:

a plurality of rail transistors configured to operate in a sub-threshold region;

an operational transconductance amplifier (OTA) to control the plurality of rail transistors and coupled within a current mirror formed by the plurality of rail transistors; and a chopper circuit coupled between terminals of the OTA and gates of the plurality of rail transistors, the chopper circuit controlled by a reference clock also used to control a second bank of switched capacitors of the sets of switched capacitors.

18. A network communication switch comprising:

an integrated circuit chip comprising a digital chip supply voltage and configured to process network packets over one or more ports, wherein the integrated circuit chip comprises:

a filter to filter the digital chip supply voltage into a filtered digital supply voltage;

a bandgap reference circuit configured to generate, from the filtered digital supply voltage, a reference voltage and a proportional-to-absolute temperature (PTAT) voltage; and a closed-loop readout circuit coupled to the bandgap reference circuit and comprising:

sets of switched capacitors that operate as a voltage divider, wherein one or more capacitors of the sets of switched capacitors are selectively charged by the PTAT voltage via first switches of the sets of switched capacitors to generate a feedback voltage, and wherein the one or more capacitors being selectively charged operate as a frequency-to-current converter;

a voltage-controlled oscillator (VCO) driven by a difference between the feedback voltage and the reference voltage and to generate a VCO clock; and a clock generator to generate a feedback clock based on the VCO clock, wherein switches of a first bank of switched capacitors of the sets of switched capacitors are controlled by the feedback clock.

19. The network communication switch of claim 18, further comprising a digital counter coupled to the clock generator, the digital counter to generate a digital output based on a number of cycles of a reference clock that fit into a cycle of the feedback clock, the digital output being linearly proportional to a temperature on which the PTAT voltage is based.

20. The network communication switch of claim 18, wherein the closed-loop readout circuit further comprises a clock divider coupled to an output of the VCO, the clock divider to divide the VCO clock into a divided clock, wherein the clock generator is a first clock generator configured to convert the divided clock into two pairs of differential clock signals that are also non-overlapping, and wherein capacitors of the first bank of switched capacitors receive the PTAT voltage and are selectively controlled by the two pairs of differential clock signals.

21. The network communication switch of claim 20, wherein the closed-loop readout circuit further comprises a second clock generator configured to convert a reference clock into a pair of clock signals that are also non-overlapping, wherein a second bank of switched capacitors of the sets of switched capacitors is controlled by the pair of clock signals.

\* \* \* \* \*